(12) United States Patent
Ullmann et al.

(10) Patent No.: US 8,217,432 B2
(45) Date of Patent: Jul. 10, 2012

(54) FIELD EFFECT TRANSISTOR AND ELECTRIC CIRCUIT

(75) Inventors: Andreas Ullmann, Zirndorf (DE); Walter Fix, Nuremberg (DE)

(73) Assignee: PolyIC GmbH & Co. KG, Furth (DE)

( * ) Notice: Subject to any disclaimer, the term of this patent is extended or adjusted under 35 U.S.C. 154(b) by 579 days.

(21) Appl. No.: 12/311,620

(22) PCT Filed: Oct. 4, 2007

(86) PCT No.: PCT/EP2007/008604
§ 371 (c)(1),
(2), (4) Date: Apr. 22, 2009

(87) PCT Pub. No.: WO2008/043475
PCT Pub. Date: Apr. 17, 2008

(65) Prior Publication Data
US 2010/0033213 A1 Feb. 11, 2010

(30) Foreign Application Priority Data
Oct. 6, 2006 (DE) .......................... 10 2006 047 388

(51) Int. Cl.
*H01L 27/148* (2006.01)
(52) U.S. Cl. ................ 257/232; 257/401; 257/E29.264; 438/286
(58) Field of Classification Search .................. None
See application file for complete search history.

(56) References Cited

U.S. PATENT DOCUMENTS

| | | | |
|---|---|---|---|
| 5,323,033 A | 6/1994 | Matsumoto et al. | |
| 5,428,303 A * | 6/1995 | Pasqualini | 326/27 |
| 6,197,663 B1 | 3/2001 | Chandross et al. | |
| 6,326,288 B1 | 12/2001 | Bornefeld | |
| 6,362,509 B1 * | 3/2002 | Hart | 257/369 |
| 6,528,816 B1 | 3/2003 | Jackson et al. | |
| 6,545,291 B1 | 4/2003 | Amundson et al. | |
| 6,559,920 B1 | 5/2003 | Ahn et al. | |
| 6,736,985 B1 | 5/2004 | Bao et al. | |
| 6,818,920 B2 | 11/2004 | DeLeeuw et al. | |
| 6,828,582 B1 * | 12/2004 | Ando et al. | 257/40 |
| 7,046,324 B2 | 5/2006 | Ohta et al. | |
| 7,105,915 B1 | 9/2006 | Finn et al. | |

(Continued)

FOREIGN PATENT DOCUMENTS

| | | |
|---|---|---|
| CN | 1312958 | 9/2001 |
| DE | 19918193 | 11/1999 |
| DE | 19920593 | 11/1999 |
| DE | 10126859 | 12/2002 |
| DE | 10330064 | 12/2004 |

(Continued)

OTHER PUBLICATIONS

U.S. Appl. No. 11/991,887, Ullmann et al.

(Continued)

*Primary Examiner* — Thomas L Dickey
*Assistant Examiner* — Scott R Wilson
(74) *Attorney, Agent, or Firm* — Carella Byrne Cecchi; Elliot M. Olstein; William Squire (57) ABSTRACT

The invention relates to a field effect transistor comprising at least one source electrode layer and at least one drain electrode layer arranged in the same plane, a semiconductor layer, an insulator layer and a gate electrode layer, wherein the gate electrode layer, as seen perpendicular to the plane of the at least one source electrode layer and the at least one drain electrode layer, only partly covers a channel arranged between the at least one source electrode layer and the at least one drain electrode layer.

15 Claims, 9 Drawing Sheets

U.S. PATENT DOCUMENTS

| | | |
|---|---|---|
| 7,442,954 B2 | 10/2008 | Clemens et al. |
| 2003/0013276 A1* | 1/2003 | Asano et al. .................. 438/459 |
| 2003/0059987 A1 | 3/2003 | Sirringhaus et al. |
| 2003/0175427 A1 | 9/2003 | Loo et al. |
| 2004/0075093 A1 | 4/2004 | Arai et al. |
| 2004/0209191 A1 | 10/2004 | Bernds et al. |
| 2004/0239586 A1 | 12/2004 | Cok |
| 2005/0051770 A1 | 3/2005 | Ando et al. |
| 2005/0062066 A1 | 3/2005 | Bao et al. |
| 2005/0098775 A1 | 5/2005 | Kondo |
| 2005/0127357 A1 | 6/2005 | Wong et al. |
| 2005/0227407 A1 | 10/2005 | Hsieh et al. |
| 2006/0118779 A1 | 6/2006 | Clemens et al. |
| 2006/0145140 A1 | 7/2006 | Fix et al. |
| 2006/0180805 A1 | 8/2006 | Lutz et al. |
| 2006/0220005 A1 | 10/2006 | Fix et al. |
| 2006/0267005 A1* | 11/2006 | Kawase et al. .................. 257/40 |
| 2008/0200030 A1 | 8/2008 | Knobloch et al. |

FOREIGN PATENT DOCUMENTS

| | | |
|---|---|---|
| DE | 10330063 | 2/2005 |
| DE | 10340641 | 4/2005 |
| EP | 1083775 | 3/2001 |
| EP | 1102335 | 5/2001 |
| EP | 1104035 | 5/2001 |
| EP | 1215725 | 6/2002 |
| EP | 1401245 | 3/2004 |
| EP | 1411554 | 4/2004 |
| EP | 1434281 | 6/2004 |
| EP | 1519418 | 3/2005 |
| GB | 2336553 | 10/1999 |
| WO | WO 9954936 | 10/1999 |
| WO | WO 9966540 | 12/1999 |
| WO | WO 0117029 | 3/2001 |
| WO | WO 0127998 | 4/2001 |
| WO | WO 0135500 | 5/2001 |
| WO | WO 0147044 | 6/2001 |
| WO | WO 02095805 | 11/2002 |
| WO | WO 2004032257 | 4/2004 |
| WO | WO 2004047144 | 6/2004 |
| WO | WO 2004068608 | 8/2004 |
| WO | WO 2004111729 | 12/2004 |
| WO | WO 2005022664 | 3/2005 |
| WO | WO 2005027216 | 3/2005 |

OTHER PUBLICATIONS

Assadi A, et al:, Field-Effect Mobility of Poly (3-Hexylthiophene) Dept. of Physics and Measurement Technology, accepted for Publication May 17, 1988.

Backlund, et al, "Towards all-polymer field-effect transistors with solution processable materials", Synthetic Metals, Elsevier Sequoia, Lausanne, CH, vol. 148, No. 1, Jan. 3, 2005, pp. 87-91.

Fix, W., et al., "Fast polymer integrated circuits", American Institute of Physics, Applied Physics Letters, vol. 81, No. 89, Aug. 2002, pp. 1735-1737.

Kawase, T. et al., "Inkjet printing of polymer thin film transistors", Thin Solid Films 438-439 (2003) 279-287.

Koezuka, H. et al., "Macromolecular Electronic Device", Mol. Cryst. Liq. Cryst. 1994, vol. 2555, pp. 221-230.

Redinger, David et al., "An all-printed passive component technology for low-cost RFID", Device Research Conference, Jun. 23, 2003, pp. 187-188.

Subramanian, V.. et al., "Printed Organic Transistors for Ultra-low-cost RFID Applications", Polymers and Adhesives in Microelectronics and Photonics, 2004, Polytronic 2004. 4$^{th}$ IEEE International Conference, Portland, OR, USA, Sep. 12-15, 2004, Piscataway, NJ, pp. 67-71.

* cited by examiner

FIELD EFFECT TRANSISTOR AND ELECTRIC CIRCUIT

The invention relates to a field effect transistor comprising at least one source electrode layer and at least one drain electrode layer arranged in the same plane, a semiconductor layer, an insulator layer and a gate electrode layer. The invention furthermore relates to a logic component, electric circuits, and a method for producing electric circuits.

Field effect transistors having the construction mentioned above are known from WO 2004/047144 A2. On a substrate, intermeshing source and drain electrode layers are disclosed which are covered in this order with a patterned semiconductor layer and a whole-area insulator layer. A patterned gate electrode layer is situated on the insulator layer. Situated between the source electrode layer and the drain electrode layer is the so-called channel, above which the gate electrode layer, here as top gate electrode, is arranged. The field effect transistor can be produced in an inexpensive printing method.

In this case, the precise registration or positioning of the gate electrode layer relative to the source/drain electrode layers is necessary since this greatly influences the switching speed of the field effect transistor. Thus, in order to improve the registration, it has already been attempted to increase the area extent of the gate electrode layer to such a degree that the latter—as seen perpendicular to the plane of the source/drain electrode layers—completely covers, and if appropriate even projects beyond, the region covered by the source and drain electrode layers and the channel region enclosed in between. A field effect transistor of this type has a good switch-on and switch-off behavior, ultimately independently of the precise arrangement of the gate electrode layer relative to the source/drain electrode layers. However, the increased area extent of the gate electrode layer gives rise to high capacitances, so-called register capacitances, as a result of which logic components and electronic circuits formed with such a field effect transistor lose speed.

It is thus an object of the invention to provide an improved field effect transistor comprising at least one electrical functional layer patterned with the aid of a printing method. It is furthermore an object of the invention to provide an electric circuit having a small space requirement and a method for producing said electric circuit.

The object is achieved for the field effect transistor comprising at least one source electrode layer and at least one drain electrode layer arranged in the same plane, a semiconductor layer, an insulator layer and a gate electrode layer, by virtue of the fact that the gate electrode layer, as seen perpendicular to the plane of the at least one source electrode layer and the at least one drain electrode layer, only partly covers a channel arranged between the at least one source electrode layer and the at least one drain electrode layer.

The area extent of the gate electrode layer is thus made significantly smaller than the area extent of the source and drain electrode layers and of the channel region arranged in between. This results in a functional field effect transistor which has electrically a similar ON current and similarly low capacitances to those achieved by a field effect transistor with a precise positioning of the gate electrode layer in register with respect to the source/drain electrode layers, even though an exact registration is not present. What is achieved in addition is that despite the surplus channel region, the space requirement for forming the field effect transistor can be reduced by up to 50% since the source/drain electrode layers can be made significantly smaller.

It is particularly preferred if the area extent of the gate electrode layer, with respect to the sum of the area extents of the source/drain electrode layers and of the channel region, is embodied such that it is reduced by the magnitude of the maximum register tolerance with the printing method used. Thus, register tolerances within the range of 400 to 40 μm can usually be achieved with the printing methods preferred here, such as intaglio printing, relief printing, planographic printing, template printing (screen printing or stencil printing) or pad printing. Both lateral register tolerances perpendicular to the printing direction and longitudinal register tolerances in the printing direction should be taken into account in this case.

The reduction of the area dimension of the gate electrode layer is preferably effected by choosing the length thereof in the printing direction to be smaller than the sum of the lengths of the source/drain electrode layers and of the channel region in the printing direction. The width of the gate electrode layer perpendicular to the printing direction can likewise be embodied in reduced fashion with respect to the sum of the widths of the source/drain electrode layers and of the channel region perpendicular to the printing direction. However, an increase in the width of the gate electrode layer perpendicular to the printing direction in accordance with the known method described above has also proved worthwhile in combination with a reduction of the length of the gate electrode layer in the printing direction.

It has proved particularly worthwhile in this case if the channel extends between the at least one source electrode layer and at least two drain electrode layers, wherein the drain electrode layers are embodied in a manner electrically insulated from one another. As a result, the leakage current of the field effect transistor that arises in channel regions not covered/overlaid by the gate electrode layer no longer has a disturbing effect on the electrical properties of the field effect transistor.

Furthermore, it has proved to be advantageous if the at least one source electrode layer is embodied in comb-shaped fashion or in the form of parallel lines that are electrically insulated from one another. A comb-shaped configuration or one in the form of parallel lines that are electrically insulated from one another has likewise proved to be worthwhile for the at least one drain electrode layer. If a plurality of drain electrode layers are provided, then a configuration of each drain electrode layer in each case in comb-shaped form has proved to be worthwhile. A comb-shaped configuration of the at least one source electrode layer in combination with a comb-shaped configuration of the at least one drain electrode layer is particularly preferred, wherein the comb teeth of the source and drain electrode layers intermesh, such that the channel runs in meandering fashion between the at least one source electrode layer and the at least one drain electrode layer. A gate electrode layer according to the invention, which is preferably embodied in a manner overlapping such comb-shaped, intermeshing source and drain electrode layers, covers the meandering channel region only partly, such that channel regions which do not contribute to the mode of operation of the field effect transistor remain unused. A positional inaccuracy of the gate electrode layer in the region of the channel region on account of the register tolerances that are unavoidable during printing is of no or virtually no significance for the electrical behavior of the field effect transistor.

It has proved to be worthwhile if the gate electrode layer, as seen perpendicular to the plane of the at least one source electrode layer and the at least one drain electrode layer, covers an area of 10 to 90%, in particular of 25 to 50%, of the channel.

The gate electrode layer can be embodied as a bottom gate electrode or as a top gate electrode. An embodiment as a bottom gate electrode involves forming, in particular on a carrier substrate, firstly the gate electrode layer, then the insulator layer, the semiconductor layer and the source/drain electrode layers. An embodiment as a top gate electrode involves forming, in particular on a carrier substrate, firstly the source/drain electrode layers, then the semiconductor layer, the insulator layer and the gate electrode layer.

A suitable carrier substrate on which the source electrode layer, the at least one drain electrode layer, the semiconductor layer—preferably printed over the whole area—, the insulator layer—preferably likewise printed over the whole area—and the gate electrode layer are preferably arranged is preferably formed from a flexible plastic film, in particular from polyester, polyethylene, polyethylene terephthalate or polyimide. It is particularly preferred in this case if an elongated flexible substrate made of plastic film, which, if appropriate, is embodied in multilayered fashion, is used as the carrier substrate. It has furthermore proved to be worthwhile if a thickness of the carrier substrate within the range of 6 µm to 200 µm, preferably within the range of 12 µm to 50 µm, is chosen.

In the case of a flexible carrier substrate it is advantageous, in particular, that said substrate can be processed in a continuous process, in particular roll-to-roll transport can be performed. In this case, the uncoated flexible carrier substrate is wound up onto a roll, the carrier substrate is unwound from the roll and led through one or more process machines for forming electrical functional layers of a multiplicity of field effect transistors and, if appropriate, further electrical components or electric circuits equipped therewith, and is finally wound up as a coated carrier substrate onto a further roll. This enables long carrier substrate strips to be processed, wherein the positioning relative to the process machine/machines only has to be effected once at the beginning of a new carrier substrate roll.

It has proved to be particularly worthwhile if the field effect transistor comprises at least one organic functional layer. All layers required for the construction of the field effect transistor are referred to as functional layer.

All types of organic, organometallic and inorganic plastics are regarded as "organic" materials for forming an organic functional layer in this case. Accordingly, a restriction in the dogmatic sense to organic material as carbon-containing material is not intended, rather the use of silicones, for example, is also envisaged. Furthermore, the term is not intended to be subject to any restriction whatsoever with regard to the molecular size, in particular to polymeric and/or oligomeric materials, rather the use of "small molecules" is perfectly possible as well.

In this case, inorganic functional layers, in particular ones formed by sputtering or vapor deposition, can be combined with organic functional layers or the field effect transistor can be constructed entirely with organic functional layers. It has proved to be worthwhile if at least one organic functional layer, in particular the semiconductor layer and/or the insulator layer, is formed by printing.

In this case, it has proved to be worthwhile to form the source/drain electrode layers and the gate electrode layer in each case from at least one metallic layer, for example from at least one of the materials gold, silver, copper, aluminum, platinum, titanium or the like. These are then preferably patterned by means of a laser or etching. Polyaniline or polypyrrole, inter alia, have proved to be worthwhile as electrically conductive organic materials for forming electrode layers. A layer stack composed of at least two layers can also be used for forming an electrode layer.

An embodiment of the semiconductor layer and/or of the insulator layer as an organic functional layer has proved to be worthwhile. Polyvinyl phenol or polyhydroxystyrene (PHS/PVP), inter alia, has proved to be worthwhile as organic insulation material. Polythiophene, for example, is suitable as organic semiconductor material.

During the positioning of a laser with respect to a functional layer already formed on a carrier substrate, usually small deviations with respect to the ideal position arise, thus resulting in a deviation of the patterned functional layer formed with respect to the layout. If a photoresist is applied to a functional layer over the whole area and exposed by means of a mask, and the non-cured regions of the resist are removed, an etching process is carried out and the photoresist is subsequently removed, then positional deviations arise here, too, for the functional layer formed relative to the layout as a result of small deviations during the positioning of the mask from its ideal position.

Furthermore, a functional layer can for example already be printed with an etching-resistant mask layer in the desired regions and the non-printed regions of the functional layer can be removed by etching. Afterward, the etching-resistant mask layer is stripped away and the regions of the functional layer that have remained underneath and are patterned in the desired form are uncovered. Deviations from the ideal position likewise arise during the printing of the mask layer in the same way as during the direct printing of a functional layer. Said deviations are transferred from the mask layer directly to the functional layer patterned thereby.

It has furthermore proved to be worthwhile if an inkjet patterning method is used, wherein high process speeds are possible. In this case, a functional layer can be formed by means of inkjet printing directly and already in the desired form on the carrier substrate. However, the inkjet method also makes it possible to apply a mask layer in order to pattern a previously formed functional layer using said mask layer.

Preferably, a relative speed of the carrier substrate with respect to a patterning unit in a continuous processing process is chosen within the range of 0.5 to 200 m/min, preferably within the range of 10 to 100 m/min. This enables mass production of electronic components and circuits with low manufacturing costs.

It has proved to be worthwhile if a functional layer of the field effect transistor is embodied with in each case a layer thickness within the range of 1 nm to 100 µm, preferably within the range of 10 nm to 300 nm.

A logic component having at least one field effect transistor according to the invention has proved to be worthwhile. Such a logic component is, in particular, a structural element from the group comprising inverter components, NOR gates, NAND gates, AND gates and OR gates.

It is particularly preferred in this case if the logic component is an inverter component comprising a field effect transistor and at least one charging component having at least one first electrode and at least one second electrode, wherein the at least one second electrode is embodied for connection to a supply voltage, and wherein at least one of the first electrodes is electrically conductively connected to at least one drain electrode layer of the field effect transistor which, as seen perpendicular to the plane of the at least one source electrode layer and the at least one drain electrode layer, overlaps the gate electrode layer at least in regions. A drain electrode layer is thus connected which adjoins a channel region with gate electrode layer.

It has proved to be worthwhile if the electrically conductive connection between the at least one first electrode and the at least one drain electrode layer of the field effect transistor is formed by at least one interconnect and/or at least one via. In this case, an interconnect is understood to be an electrical connection in one plane, while a via is understood to be an electrically conductive connection across a plurality of planes.

Preferably, the inverter component comprises a field effect transistor having at least one source electrode layer and at least two drain electrode layers and also comprises the at least one charging component having at least two first electrodes, wherein a respective one of the drain electrode layers is electrically conductively connected to a respective one of the first electrodes.

An electric circuit comprising at least one logic component according to the invention has been proved to be worthwhile. An electric circuit comprising at least two logic components, in particular at least two inverter components, is particularly preferred in this case.

In this case, it has proved to be advantageous if a first inverter component has a first gate electrode layer, and the first gate electrode layer is electrically conductively connected to the at least one interconnect and/or the at least one via of a second inverter component which is assigned to a second inverter component and electrically conductively connects the at least one drain electrode layer and the at least one first electrode of the charging component of the second inverter component to one another.

In this case, it has proved to be worthwhile if the at least one interconnect is arranged on the plane of the at least one source electrode layer and the at least one drain electrode layer, and the first gate electrode layer and the at least one interconnect are electrically conductively connected to one another by means of at least one via in the semiconductor layer and the insulator layer.

However, it has also proved to be worthwhile in this case if the first gate electrode layer is electrically conductively connected to the at least one drain electrode layer and the at least one first electrode of the second inverter component by means of at least one via in the semiconductor layer and the insulator layer. What is particularly preferred in this case is a method in which by means of at least one via in the semiconductor layer and the insulator layer, with the formation of the gate electrode layer, the electrically conductive connection to the at least one drain electrode layer and the at least one first electrode of the second inverter component is also formed simultaneously.

The object is achieved for the electric circuit on a carrier substrate, wherein at least one first component and at least one second component, which are electrically conductively connected to one another, are formed on the carrier substrate, by virtue of the fact that at least two second components are formed, wherein an electrically conductive functional layer of the first component is electrically conductively connected to an electrically conductive functional layer of one of the at least two second components by means of a printed interconnect, wherein the at least one first component is alternatively connected to one or the other of the at least two second components and at least one unused, surplus second component is thus present.

Even though space for surplus second components is provided in the case of the electric circuit according to the invention on the carrier substrate, up to 50% of the area can nevertheless be saved by comparison with conventional electric circuits, without impairment of the essential properties of the electric circuit occurring, since the individual structural elements of the electric circuit can be made significantly smaller. Depending on the register tolerance present during the printing of the interconnect, one of the at least two second components is electrically conductively connected to the at least one first component.

In this case, it is preferred if the at least two second components are arranged one after another and adjacent to one another in the printing direction of the interconnect. In this case, the distance between the second components should be coordinated with the register tolerances that actually occur during printing.

Furthermore, it has proved to be worthwhile if at least two first components are formed, and one of the first components is electrically conductively connected to one of the second components by means of the interconnect, such that at least one first component and at least one second component are present in unused and surplus fashion.

For the at least two first components too, it is advantageous if they are arranged one after another and adjacent to one another as seen in the printing direction of the interconnect.

In particular, it has proved to be worthwhile if a field, effect transistor according to the invention is embodied as first component, said transistor having at least one drain electrode layer as electrically conductive functional layer.

In combination with the field effect transistor according to the invention, it has proved to be worthwhile if the second component is embodied as a charging component having at least one first electrode as electrically conductive functional layer and at least one second electrode, wherein the at least one second electrode is embodied for connection to a supply voltage.

The object is achieved for the method for producing an electric circuit on a carrier substrate, wherein at least one first component and at least one second component, which are electrically conductively connected to one another, are formed on the carrier substrate, by virtue of the fact that at least two second components are formed, that an electrically conductive functional layer of the first component is electrically conductively connected to an electrically conductive functional layer of one of the at least two second components by printing an interconnect, wherein the at least one first component, depending on the register tolerance during the printing of the interconnect, is alternatively connected to one or the other of the at least two second components and at least one second component thus remains unused.

In this case, it is preferred if the at least two second components are arranged one after another and adjacent to one another as seen in the printing direction of the interconnect.

Preferably, furthermore at least two first components are formed, and one of the first components is electrically conductively connected to one of the second components by means of the interconnect, such that at least one first component and at least one second component remain unused.

The at least two first components, too, are preferably arranged one after another and adjacent to one another as seen in the printing direction of the interconnect.

FIGS. 1a to 7 are intended to elucidate by way of example the field effect transistor according to the invention and its use in logic components and electric circuits. Thus:

Figure 1A:
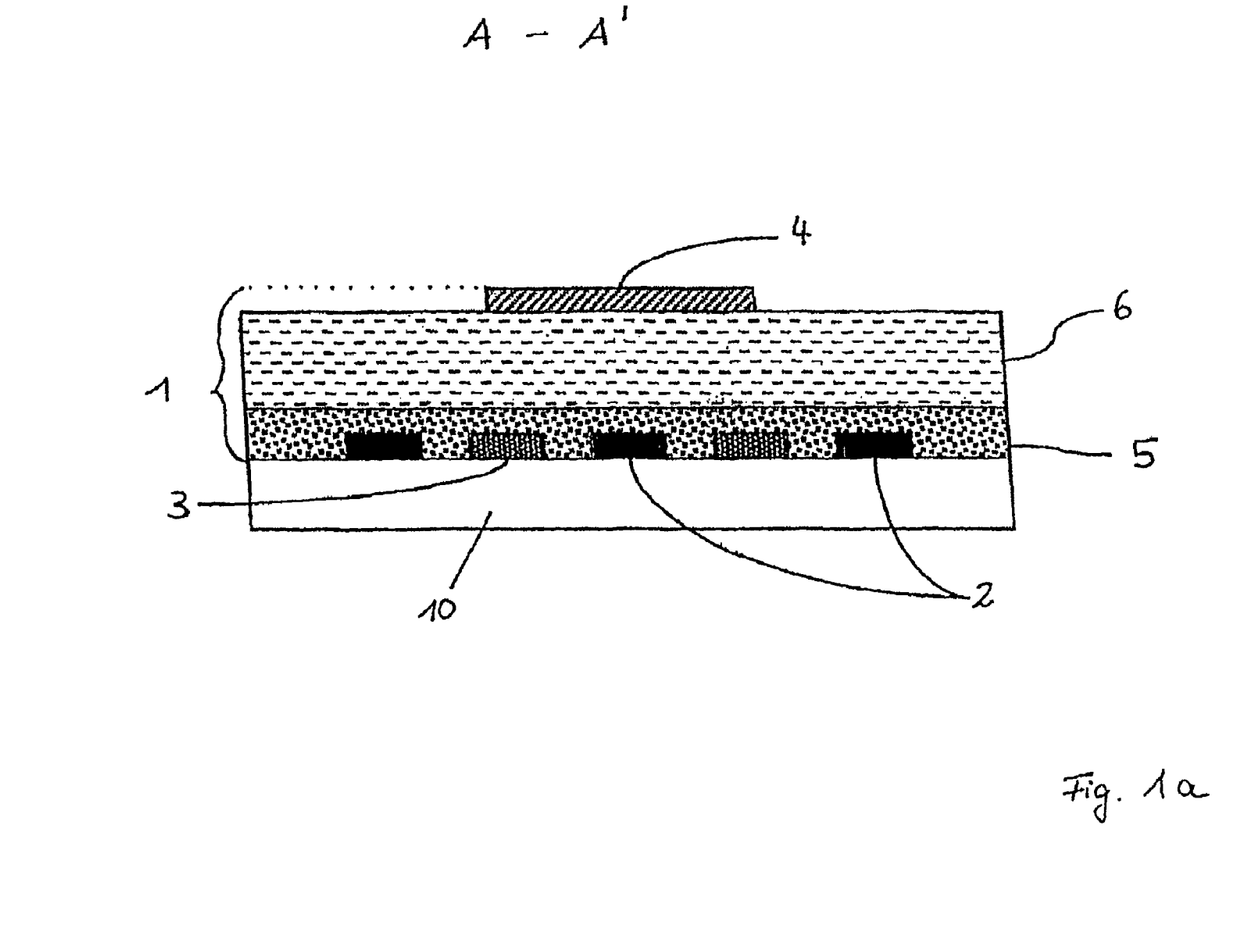
FIG. 1a is an elevation cross section view through the field effect transistor of FIG. 1b arranged on a carrier substrate taken at line A-A' of FIG. 1b.

FIG. 1a shows a cross section A-A' through a field effect transistor 1 arranged on a carrier substrate 10 made of PET. The field effect transistor 1 comprises as functional layers a source electrode layer 2 patterned in comb-shaped fashion and made of gold, silver, PEDOT or PANI and, in the same plane, a drain electrode layer 3 patterned in comb-shaped fashion and made of the same material. A semiconductor layer 5 made of polythiophene and an insulator layer 6 made of polyhydroxystyrene (PHS/PVP) are printed thereon over the whole area. A gate electrode layer 4 is situated on the insulator layer 6, said gate electrode layer only partly covering the channel 7 (see FIG. 1b) between the source electrode layer 2 and the drain electrode layer 3.

Figure 1B:
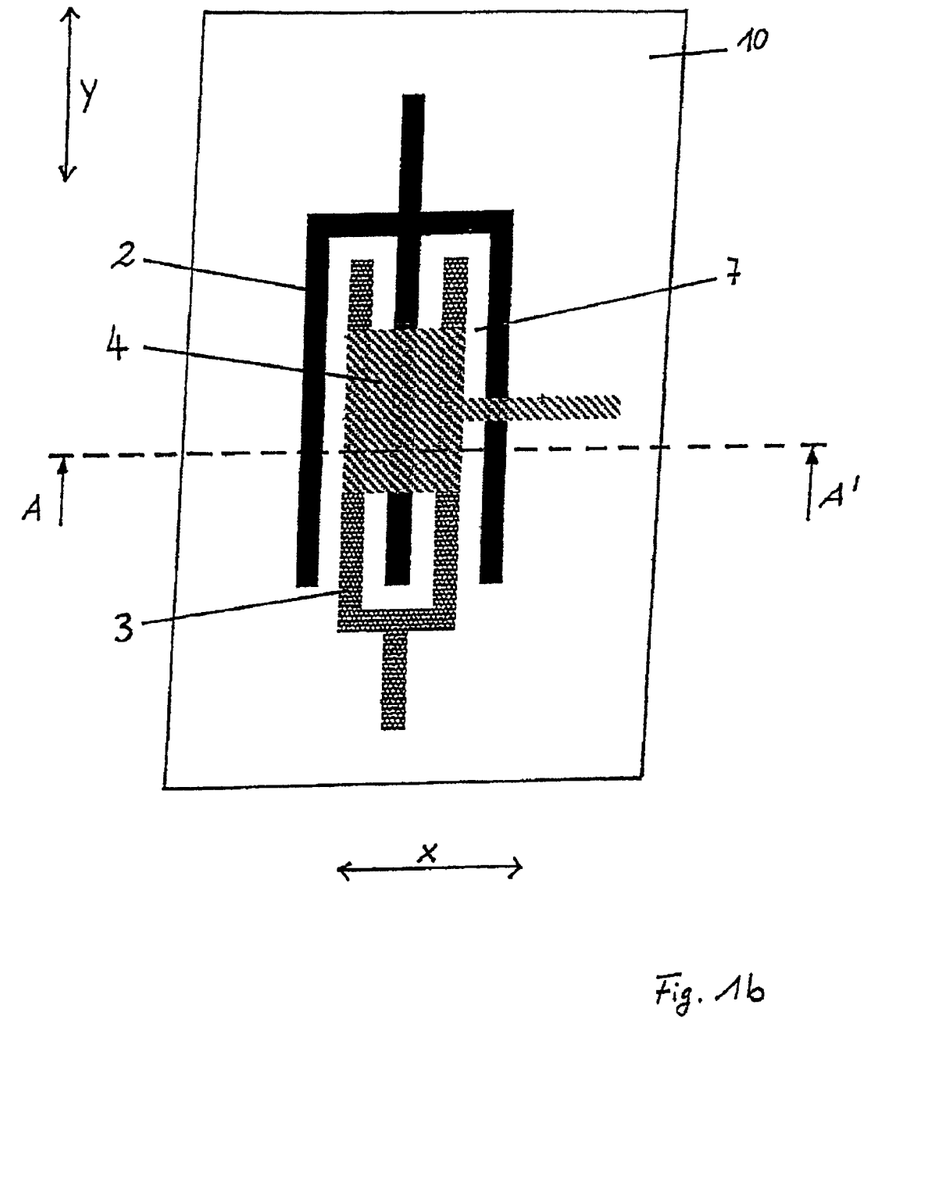
FIG. 1b is a simplified diagrammatic plan view of a field effect transistor and a carrier substrate according to an embodiment of the present invention.

FIG. 1b shows a simplified plan view of the field effect transistor 1 and the carrier substrate 10 from FIG. 1a, wherein the illustration of the semiconductor layer 5 and of the insulator layer 6 has been disregarded. Consequently, FIG. 1b reveals the position of the comb-shaped source electrode layer 2 having three comb teeth relative to the comb-shaped drain electrode layer 3 having two comb teeth, which are arranged in a manner intermeshed with one another on the carrier substrate 10. Situated between the source electrode layer 2 and the drain electrode layer 3 is the channel 7, which exhibits a meandering course as seen perpendicular to the plane of the carrier substrate 10. The semiconductor layer 5 arranged on the source electrode layer 2 and the drain electrode layer 3 and the insulator layer 6 are not depicted here, in order to be able to demonstrate the position and area extent of the gate electrode layer 4 with respect to the channel 7. It is evident that the gate electrode layer 4 only partly covers the channel 7. A positional displacement of the gate electrode layer 4 with regard to its orientation toward the source electrode layer 2 and the drain electrode layer 3 in the identified x directions or y directions on account of register tolerances during the formation of the gate electrode layer 4 does not affect essential electrical properties of the field effect transistor 1 (ON current, capacitance), since the area extent of the gate electrode layer 4 is chosen such that even in the event of a production-dictated maximum possible displacement of the gate electrode layer 4 in the x and/or y direction, a position of parts of the gate electrode layer 4 outside the channel region delimited by the source and drain electrode layers 2, 3 is not possible.

The simplest embodiment of the field effect transistor according to the invention would be here one which exhibits a comb-shaped source electrode layer which is embodied at least with two comb tines connected to one another and has a merely strip-shaped drain electrode layer situated between the two comb tines of the source electrode layer.

Figure 2A:
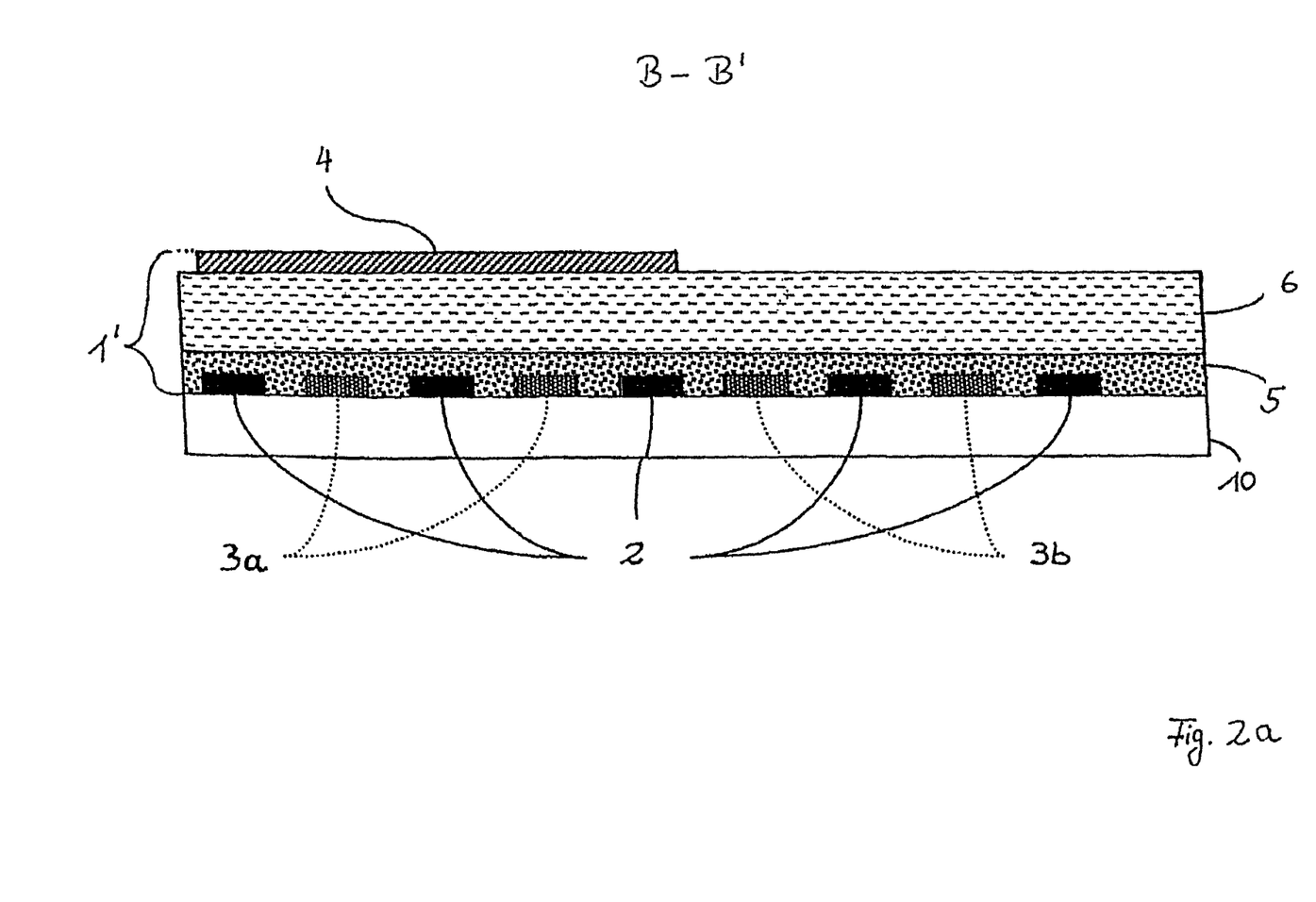
FIG. 2a is an elevation cross section view through a further field effect transistor arranged on a carrier substrate taken at line B-B' of FIG. 1b.

FIG. 2a shows a cross section B-B' through a further field effect transistor 1' arranged on a carrier substrate 10. The field effect transistor 1' comprises as functional layers a source electrode layer 2 patterned in comb-shaped fashion and made of gold, silver, PEDOT or PANI and, in the same plane, two drain electrode layers 3a, 3b patterned in comb-shaped fashion and made of the same material, said drain electrode layers being electrically insulated from one another. A semiconductor layer 5 made of a printable polymeric material, such as polythiophene, and an insulator layer 6 made of polyhydroxystyrene (PSH/PVP) are printed thereon over the whole area. A gate electrode layer 4 is situated on the insulator layer 6, said gate electrode layer only partly covering the channel 7 (see FIG. 2b) between the source electrode layer 2 and the drain electrode layers 3a, 3b. Alternatively, the drain electrode layers could also be embodied here in such a way that they are merely embodied in the form of four lines lying next to one another which in each case project into the comb-shaped source electrode layer 2 and are not electrically conductively connected to one another. The source electrode layer could also be embodied merely in the form of lines, such that a plurality of source electrode layers, here in particular five source electrode layers, could be present without electrical contact next to one another on the carrier substrate 10.

Figure 2B:
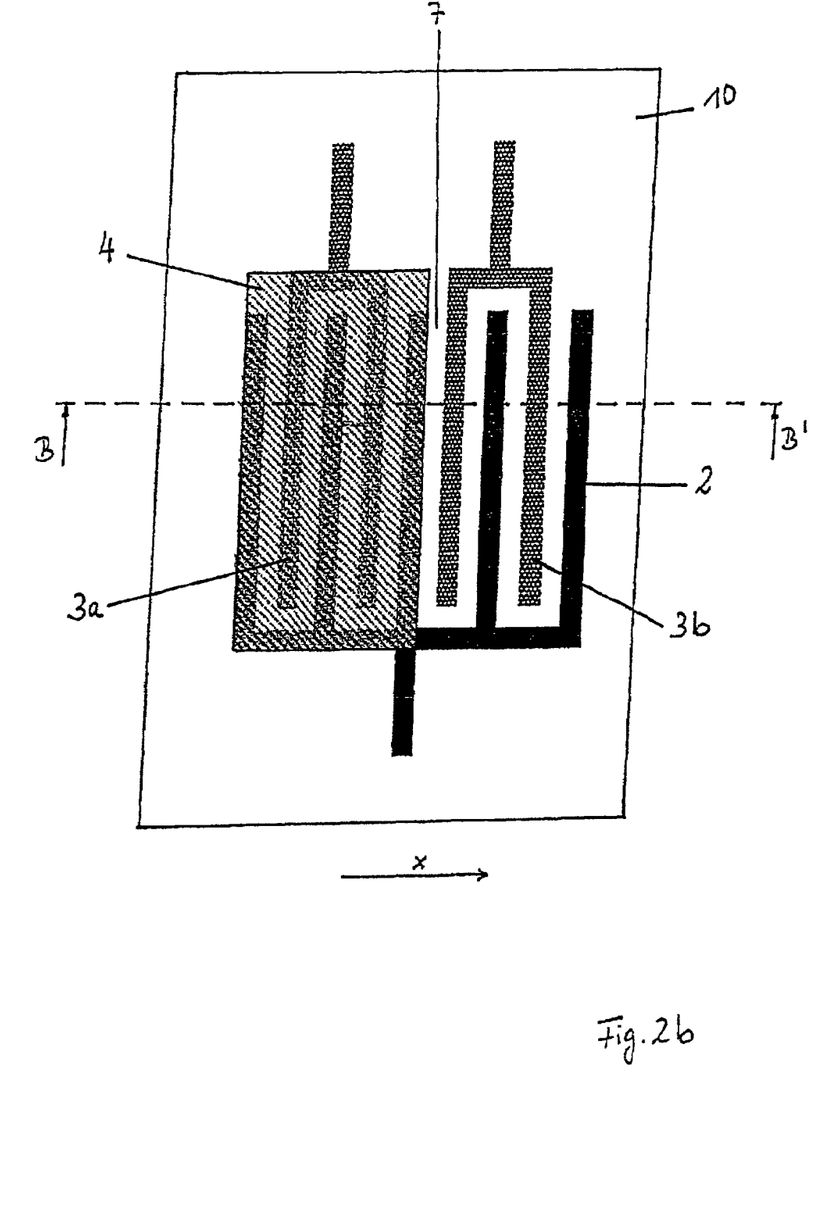
FIG. 2b is a simplified diagrammatic plan view of the transistor of FIG. 1b and a further field effect transistor and the carrier substrate according to a further embodiment of the present invention.

FIG. 2b shows the simplified plan view of the field effect transistor 1' and the carrier substrate 10 from FIG. 2a, wherein the illustration of the semiconductor layer 5 and of the insulator layer 6 has been disregarded. Consequently, FIG. 2b reveals the position of the comb-shaped source electrode layer 2 having five comb teeth relative to the two comb-shaped drain electrode layers 3a, 3b each having two comb teeth, which are arranged in a manner intermeshed with one another on the carrier substrate 10. Situated between the source electrode layer 2 and the drain electrode layers 3a, 3b is the channel 7, which exhibits a meandering course as seen perpendicular to the plane of the carrier substrate 10. The semiconductor layer 5 arranged on the source electrode layer 2 and the drain electrode layers 3a, 3b and the insulator layer 6 are not depicted here, in order to be able to demonstrate the position and area extent of the gate electrode layer 4 with respect to the channel 7. It is evident that the gate electrode layer 4 only partly covers the channel 7. A positional displacement of the gate electrode layer 4 with regard to its orientation toward the source electrode layer 2 and the drain electrode layers 3a, 3b in the identified x direction on account of register tolerances during the formation of the gate electrode layer 4 does not affect the electrical properties of the field effect transistor 1', since the area extent of the gate electrode layer 4 is chosen such that even in the event of a production-dictated maximum possible displacement of the gate electrode layer 4 in the identified x direction, a position of parts of the gate electrode layer 4 outside the channel region delimited by the source and drain electrode layers 2, 3a, 3b is not possible. Alternatively, the field effect transistor in accordance with FIGS. 2a and 2b can also be embodied with three or more drain electrode layers, wherein the gate electrode layer covers at least one drain electrode layer, or else a plurality of drain electrode layers simultaneously. However, at least one drain electrode layer and/or a channel region are/is present as a surplus or unused structure.

Figure 3:
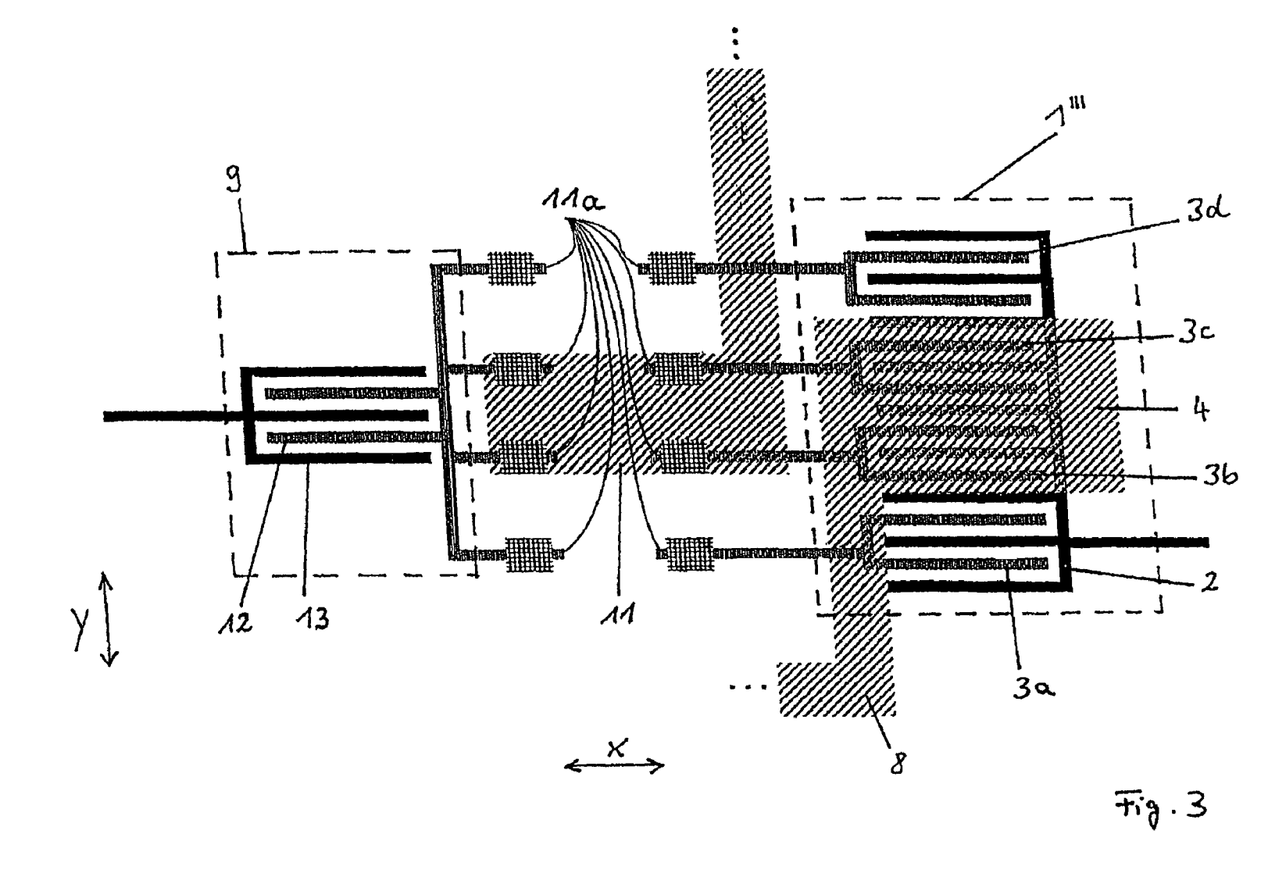
FIG. 3 is a simplified diagrammatic plan view of a logic component forming an inverter component.

FIG. 3 shows in the simplified plan view a logic component in the form of an inverter component having a field effect transistor 1''' and a charging component 9. The inverter input of the inverter component is identified by the reference symbol 8. In order to better visualize the position of the diverse electrode layers with respect to one another, the illustration of the semiconductor layers and of the insulator layers has been dispensed with in FIG. 3. The field effect transistor 1''' has a source electrode layer 2 and four drain electrode layers 3a, 3b, 3c, 3d that are electrically insulated from one another. The source electrode layer 2 can be connected to a first supply voltage $U_1$. The gate electrode layer 4 of the field effect transistor 1''' only covers the two central drain electrode layers 3a, 3b, while the two outer drain electrode layers 3a, 3d are not covered and are thus unused. A positional inaccuracy of the gate electrode layer 4 on account of register tolerances can be compensated for in the y directions by the surplus drain electrode layers 3a, 3d. A positional inaccuracy of the gate electrode layer 4 on account of register tolerances in the x directions is compensated for by the increased width of the gate electrode layer 4 relative to the width of the source and drain electrode layers 2, 3a, 3b, 3c, 3d. The charging component 9 has a first electrode 12 and a second electrode 13, wherein the second electrode 13 can be connected to a supply voltage.

The drain electrode layers 3b, 3c are electrically conductively connected to the first electrode 12 of the charging component 9 by means of an interconnect 11. Openings, so-called vias 11a, are provided in the semiconductor layer and insulator layer (not separately illustrated), in order to be able to produce an electrically conductive connection between the source/drain plane and the gate plane. The interconnect 11 that electrically conductively connects the drain electrode layers 3b, 3c to the second electrode 13 of the charging component 9 by means of at least one of the vias 11a arranged thereabove or therebelow forms the gate electrode layer 4 of the field effect transistor 1''', or the inverter input 8 of the inverter component, or is electrically conductively connected thereto directly or indirectly by means of vias.

Figure 4:
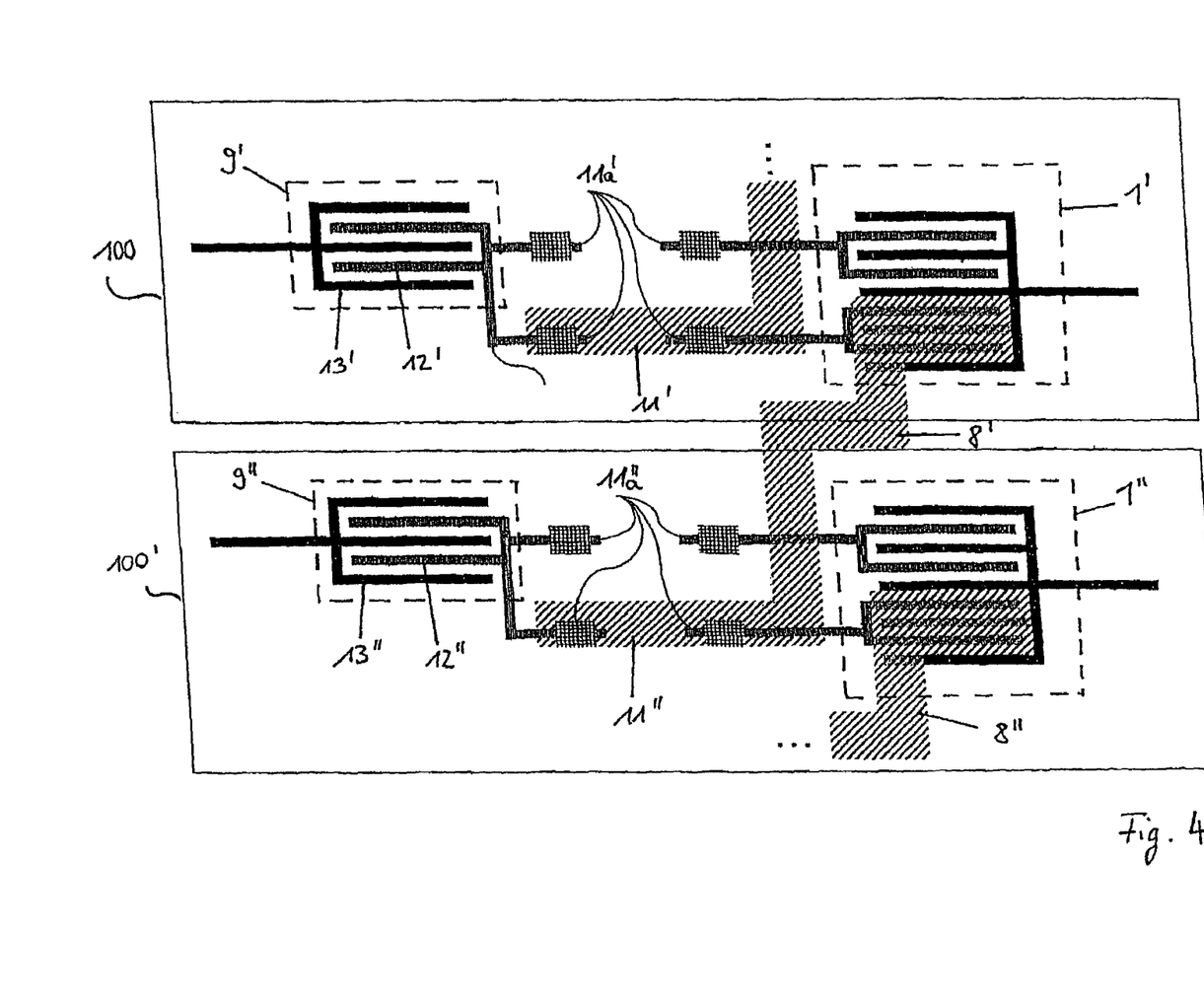
FIG. 4 is a simplified diagrammatic plan view of an electric circuit having two logic components, wherein each logic component comprises a charging component.

FIG. 4 shows in the simplified plan view an electric circuit having a first logic component in the form of a first inverter component 100, enclosed by a line in order to identify the associated structural elements, and a second logic component, which is embodied in the form of a second inverter component 100' and is likewise enclosed by a line in order to identify the associated structural elements. In order to better visualize the position of the diverse electrode layers with respect to one another, the illustration of the semiconductor layers and of the insulator layers has been dispensed with in FIG. 4.

The first inverter component 100 has a field effect transistor 1' in accordance with FIGS. 2a, 2b and a first charging component 9'. The source electrode layer 2 (see FIG. 2b) of the first field effect transistor 1' is connected to a first supply voltage $U_1$. The first charging component 9' has a first electrode 12' and a second electrode 13', wherein the second electrode 13' is connected to a second supply voltage $U_2$. The inverter input of the first inverter component 100 is identified by the reference symbol 8'. The first drain electrode layer 3a (see FIG. 2b) of the first field effect transistor 1' is electrically conductively connected to the first electrode 12' of the first charging component 9' by means of an interconnect 11'.

The second inverter component 100' has a field effect transistor 1'', which is embodied structurally identically to the first inverter component 1', and a second charging component 9'', which is embodied structurally identically to the first charging component 9' and has a first electrode 12'' and a second electrode 13'', which is connected to a second supply voltage $U_2$. The inverter input of the second inverter component 100' is identified by the reference symbol 8''. The first drain electrode layer 3a (see FIG. 2b) of the second field effect transistor 1'' is electrically conductively connected to the first electrode 12'' of the second charging component 9'' by means of an interconnect 11''.

Openings, so-called vias 11a', 1a'', are provided in the semiconductor layer and insulator layer (not separately illustrated), in order to be able to produce an electrically conductive connection between the source/drain plane and the gate plane.

The interconnect 11'' of the second inverter component 100' that electrically conductively connects the first drain electrode layer 3a (see FIG. 2b) of the second field effect transistor 1'' to the first electrode 12'' of the second charging component 9'' by means of at least one of the two vias 11a'' arranged thereabove or therebelow forms the gate electrode layer 4 of the first field effect transistor 1', or the inverter input 8' of the first inverter component 100, or is electrically conductively connected thereto directly or indirectly by means of vias.

The interconnect 11' of the first inverter component 100 that electrically conductively connects the first drain electrode layer 3a (see FIG. 2b) of the first field effect transistor 1' to the first electrode 12' of the first charging component 9' is electrically conductively connected to a further electrical component by means of at least one of the two vias 11a' arranged thereabove or therebelow.

The interconnects 11', 11'' of the first and second inverter components 100, 100' are formed here simultaneously with the formation of the gate electrode layers 4.

Figure 5:
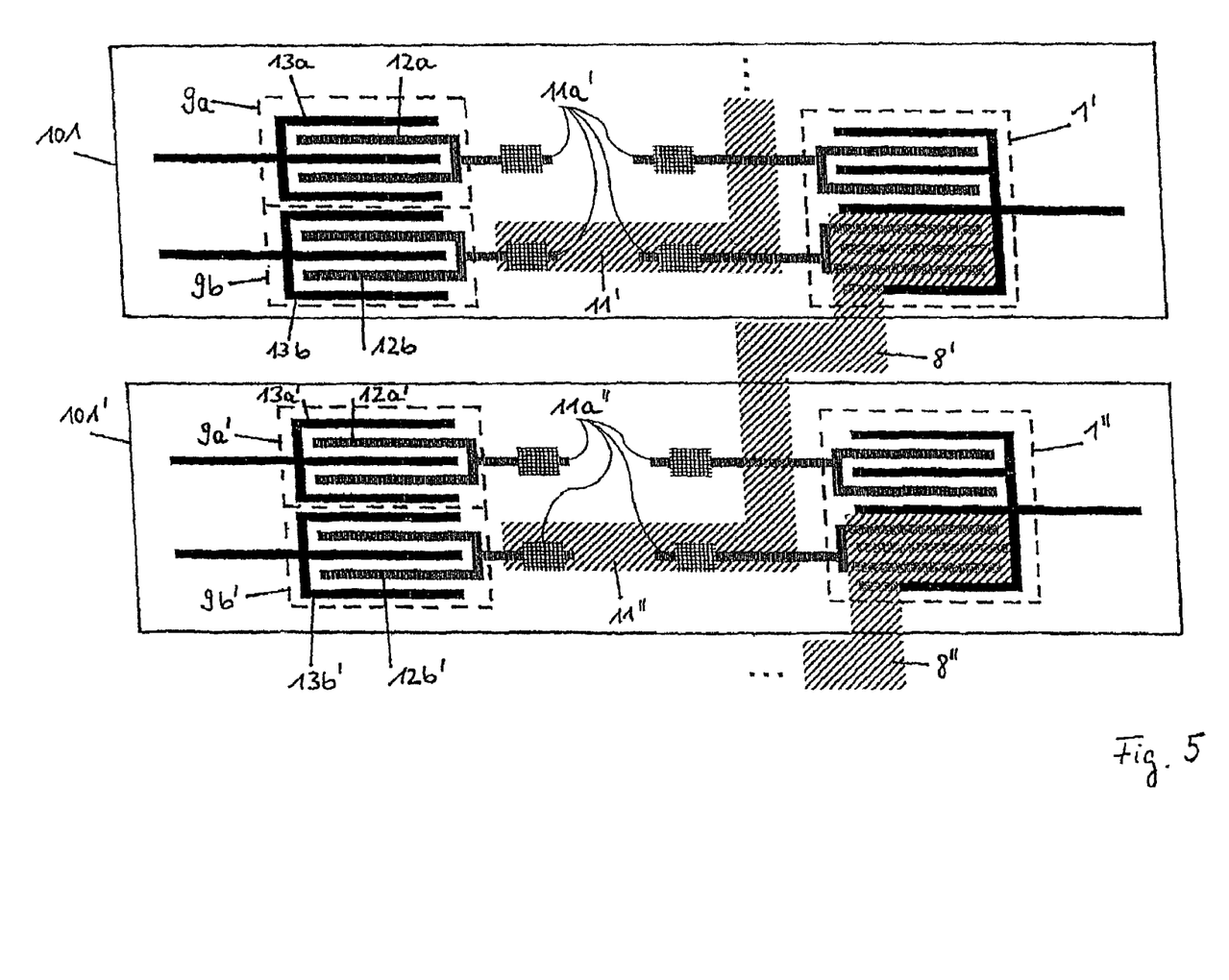
FIG. 5 is a simplified diagrammatic plan view of an electric circuit having two logic components, wherein each logic component comprises two charging components.

FIG. 5 shows in the simplified plan view a similar electric circuit to FIG. 4. The electric circuit has a first logic component in the form of a first inverter component 101, enclosed by a line in order to identify the associated structural elements, and a second logic component in the form of a second inverter component 101', which is likewise enclosed by a line in order to identify the associated structural elements. In order to better visualize the position of the diverse electrode layers with respect to one another, the illustration of the semiconductor layers and of the insulator layers has been dispensed with here, too, as already in FIG. 4.

The first inverter component 101 has a field effect transistor 1' in accordance with FIGS. 2a, 2b and a first charging component 9a and a second charging component 9b. The source electrode layer 2 (see FIG. 2b) of the first field effect transistor 1' is connected to a first supply voltage $U_1$. The first charging component 9a has a first electrode 12a and a second electrode 13a, wherein the second electrode 13a is connected to a second supply voltage $U_2$. The second charging component 9b has a first electrode 12b and a second electrode 13b, wherein the second electrode 13b is likewise connected to the second supply voltage $U_2$. The inverter input of the first inverter component 101 is identified by the reference symbol 8'. The first drain electrode layer 3a (see FIG. 2b) of the first field effect transistor 1' is electrically conductively connected to the first electrode 12b of the second charging component 9b by means of an interconnect 11'.

The second inverter component 101' has a field effect transistor 1'', which is embodied structurally identically to the first inverter component 1', and a third charging component 9a', which is embodied structurally identically to the first charging component 9a, and a fourth charging component 9b', which is embodied structurally identically to the second charging component 9b. The third charging component 9a' has a first electrode 12a' and a second electrode 13a', which is connected to a second supply voltage $U_2$. The fourth charging component 9b' has a first electrode 12b' and a second electrode 13b', which is connected to the second supply voltage $U_2$. The inverter input of the second inverter component 101' is identified by the reference symbol 8''. The first drain electrode layer 3*a* (see FIG. 2*b*) of the second field effect transistor 1" is electrically conductively connected to the first electrode 12*b'* of the fourth charging component 9*b'* by means of an interconnect 11".

Openings, so-called vias 11*a'*, 11*a"*, are provided in the semiconductor layer and insulator layer (not separately illustrated), in order to be able to produce an electrically conductive connection between the source/drain plane and the gate plane.

The interconnect 11" of the second inverter component 101' that electrically conductively connects the first drain electrode layer 3*a* (see FIG. 2*b*) of the second field effect transistor 1" to the first electrode 12*b'* of the fourth charging component 9*b'* by means of at least one of the two vias 11*a"* arranged thereabove or therebelow forms the gate electrode layer 4 of the first field effect transistor 1', or the inverter input 8' of the first inverter component 101, or is electrically conductively connected thereto directly or indirectly by means of vias.

The interconnect 11' of the first inverter component 101 that electrically conductively connects the first drain electrode layer 3*a* (see FIG. 2*b*) of the first field effect transistor 1' to the first electrode 12*b* of the second charging component 9*b* is electrically conductively connected to a further electrical component by means of at least one of the two vias 11*a'* arranged thereabove or therebelow.

The interconnects 11', 11" of the first and second inverter components 101, 101' are formed here simultaneously with the formation of the gate electrode layers 4. Since no electrically conductive connection is formed between the first charging component 9*a* and the field effect transistor 1', and between the charging component 9*a'* and the field effect transistor 1", no leakage currents occur here either.

Figure 6:
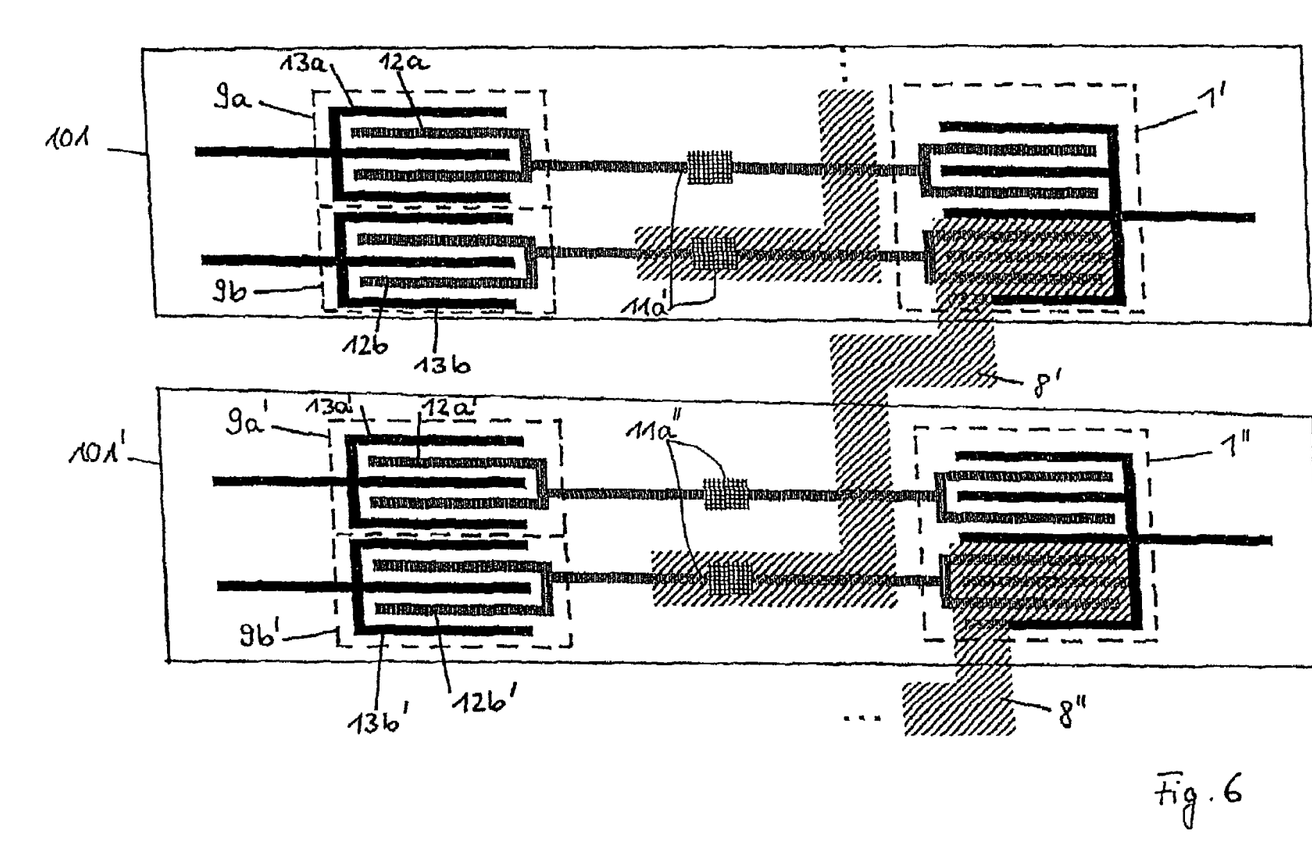
FIG. 6 is a simplified diagrammatic plan view of a further electric circuit having two logic components, wherein each logic component comprises two charging components.

FIG. 6 shows in the simplified plan view a similar electric circuit to FIG. 5. The electric circuit has a first logic component in the form of a first inverter component 101, enclosed by a line in order to identify the associated structural elements, and a second logic component in the form of a second inverter component 101', which is likewise enclosed by a line in order to identify the associated structural elements. In order to better visualize the position of the diverse electrode layers with respect to one another, the illustration of the semiconductor layers and of the insulator layers has been dispensed with here, too, as already in FIGS. 4 and 5.

The first inverter component 101 has a field effect transistor 1' in accordance with FIGS. 2*a*, 2*b* and a first charging component 9*a* and a second charging component 9*b*. The source electrode layer 2 (see FIG. 2*b*) of the first field effect transistor 1' is connected to a first supply voltage $U_1$. The first charging component 9*a* has a first electrode 12*a* and a second electrode 13*a*. The second charging component 9*b* has a first electrode 12*b* and a second electrode 13*b*, wherein the second electrode 13*b* is connected to a second supply voltage $U_2$. The inverter input of the first inverter component 101 is identified by the reference symbol 8'. The first drain electrode layer 3*a* (see FIG. 2*b*) of the first field effect transistor 1' is electrically conductively connected to the first electrode 12*b* of the second charging component 9*b* by means of a via 11*a'*.

The second inverter component 101' has a field effect transistor 1", which is embodied structurally identically to the first inverter component 1', and furthermore a third charging component 9*a'*, which is embodied structurally identically to the first charging component 9*a*, and a fourth charging component 9*b'*, which is embodied structurally identically to the second charging component 9*b*. The third charging component 9*a'* has a first electrode 12*a'* and a second electrode 13*a'*. The fourth charging component 9*b'* has a first electrode 12*b'* and a second electrode 13*b'*, which is connected to a second supply voltage $U_2$. The inverter input of the second inverter component 101' is identified by the reference symbol 8". The first drain electrode layer 3*a* (see FIG. 2*b*) of the second field effect transistor 1" is electrically conductively connected to the first electrode 12*b'* of the fourth charging component 9*b'* by means of a via 11*a"*.

The vias 11*a'*, 11*a"* form openings in the semiconductor layer and insulator layer (not separately illustrated), in order to be able to produce an electrically conductive connection between the source/drain plane and the gate plane.

The first drain electrode layer 3*a* (see FIG. 2*b*) of the second field effect transistor 1", which layer is electrically conductively connected to the first electrode 12*b'* of the fourth charging component 9*b'*, is furthermore electrically conductively connected, by means of a via 11*a"*, to the gate electrode layer 4 of the first field effect transistor 1' or the inverter input 8' of the first inverter component 101.

The first drain electrode layer 3*a* (see FIG. 2*b*) of the first field effect transistor 1', which layer is electrically conductively connected to the first electrode 12*b* of the second charging component 9*b*, is furthermore electrically conductively connected to a further electrical component by means of a via 11*a'*.

Since, unlike in FIG. 5, an electrically conductive connection is formed between the first charging component 9*a* and the field effect transistor 1', and between the charging component 9*a'* and the field effect transistor 1", small leakage currents occur here.

Figure 7:
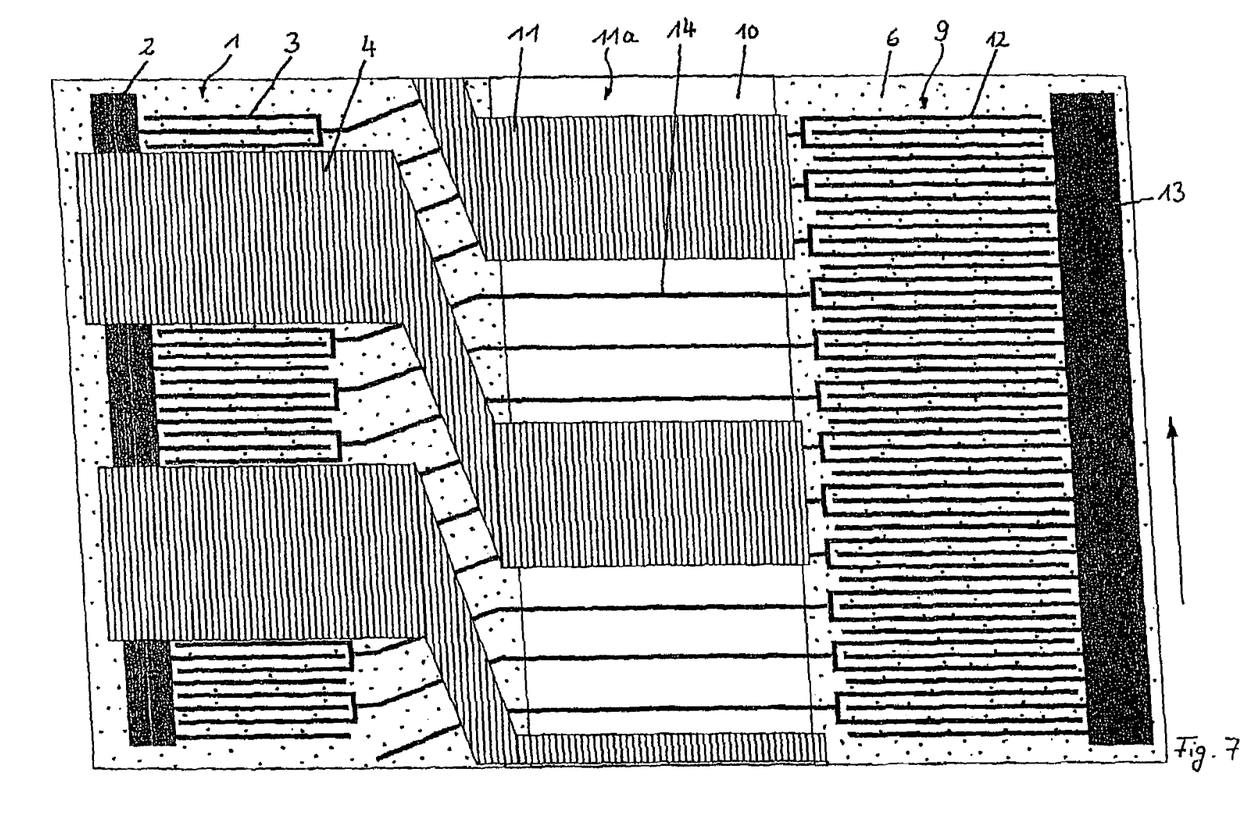
FIG. 7 is a simplified diagrammatic plan view of an embodiment of a layout of an electric circuit having a multiplicity of logic components in accordance with FIG. 6.

FIG. 7 shows in plan view a preferred layout for a printed electric circuit in accordance with FIG. 6 on a carrier substrate 10, wherein a multiplicity of logic components comprising field effect transistors 1 and charging components 9 are provided one after another in series in the printing direction (see the arrow on the far right). On the left-hand side of the carrier substrate 10, the electric circuit has a multiplicity of field effect transistors 1 which are embodied similarly to FIG. 1*b* on the carrier substrate 10 with in each case a source electrode layer 2, a drain electrode layer 3, thereon a semiconductor layer (not visible here) and thereon an insulator layer 6, and in each case a gate electrode layer 4 on the insulator layer 6. The source electrode layer 2 of the field effect transistors 1 is connected to a first supply voltage $U_1$. Non-connected source/drain regions, that is to say channel regions not covered by a gate electrode layer 4, between source and drain electrode layers 2, 3 are further discernible.

A multiplicity of charging components 9 each having a first electrode 12 and a second electrode 13 are situated on the right-hand side of the carrier substrate 10, wherein the second electrode 13 is connected to a second supply voltage $U_2$.

In order to better visualize the position of the diverse electrode layers 2, 3, 4, 12, 13 with respect to one another, here the electrode layers 2, 3, 12, 13 arranged below the insulator layer 6 or below the insulator layer 6 and if appropriate the semiconductor layer are visible through the insulator layer 6.

A respective drain electrode layer 3 is electrically conductively connected to a first electrode 12 of a charging component by means of an interconnect 14. Situated between the field effect transistors 1 on the left-hand side and the charging components 9 on the right-hand side of the carrier substrate 10 is a strip-shaped opening in the printing direction, in which opening no semiconductor layer and no insulator layer 6 are arranged, rather the carrier substrate 10 with interconnects 14 printed thereon can be directly discerned. Said strip-shaped opening forms a via 11*a*, in which an electrically conductive connection between interconnects 14 and the gate electrode layer 4 printed onto the insulator layer 6 is formed by means of an interconnect 11. An electrically conductive connection of the respective gate electrode layer 4 to charging components 9 on the right-hand side and to drain electrode layers 3 of the adjacent field effect transistor 1 that are electrically conductively connected to precisely said charging components 9 is produced in this case.

Since a respective electrically conductive connection or interconnect 14 is formed between all of the first electrodes 12 of the charging components 9 and the drain electrode layers 3 of the field effect transistors 1, small leakage currents occur here in the region of non-connected source/drain electrode layers 2, 3.

The field effect transistor according to the invention can thus be embodied in different forms and layouts and be used for forming a multiplicity of different logic components and electric circuits.

The invention claimed is:

1. In a logic component comprising at least one field effect transistor:
    the at least one field effect transistor comprising:
        at least one source electrode layer and a plurality of drain electrode layers arranged in the same plane;
        a semiconductor layer overlying the at least one source electrode layer and the plurality of drain electrode layers;
        an insulator layer overlying the semiconductor layer; and
        a gate electrode layer on the insulator layer, wherein as seen perpendicular to the plane of the at least one source electrode layer and the plurality of drain electrode layers the gate electrode layers is juxtaposed with only a portion of the source electrode layer and only a portion of the plurality of drain electrode layers such that only the portion of the source electrode layer and portion of the plurality of the drain electrode layers that are juxtaposed with the gate electrode layer are electrically operative as a transistor;
    wherein the logic component is a structural element selected from one of the group consisting of inverter components, NOR gates, NAND gates, AND gates and OR gates and wherein the logic component comprises an inverter component comprising said field effect transistor and at least one charging component having at least one first electrode and at least one second electrode, wherein the at least one second electrode is arranged for connection to a supply voltage, and wherein the at least one first electrode comprises a plurality of electrodes wherein at least one of the plurality of electrodes is electrically conductively connected to said plurality of drain electrode layers of the field effect transistor which, as seen perpendicular to the plane of the at least one source electrode layer and the plurality of drain electrode layers overlaps at least a portion of the gate electrode layer.

2. In the logic component as claimed in claim 1 wherein the electrically conductive connection between the at least one first electrode and the plurality of drain electrode layers of the field effect transistor is formed by at least one of an interconnect or via.

3. In the logic component as claimed in claim 1 wherein the inverter component field effect transistor has at least one source electrode layer and at least two drain electrode layers and the at least one charging component comprises at least two charging components having at least two first electrodes, wherein a respective one of the at least two drain electrode layers is electrically conductively connected to a respective one of the first electrodes.

4. An electronic circuit comprising:
    a logic component including at least one field effect transistor;
    the field effect transistor comprising:
        at least one source electrode layer and a plurality of drain electrode layers arranged in the same plane;
        a semiconductor layer overlying the at least one source electrode layer and the plurality of drain electrode layers;
        an insulator layer overlying the semiconductor layer; and
        a gate electrode layer on the insulator layer, wherein as seen perpendicular to the plane of the at least one source electrode layer and the plurality of drain electrode layers the gate electrode layers is juxtaposed with only a portion of the source electrode layer and only a portion of the plurality of drain electrode layers such that only the portion of the source electrode layer and portion of the plurality of the drain electrode layers that are juxtaposed with the gate electrode layer are electrically operative as a transistor; and
    the electronic circuit further comprising a plurality of electronic components electrically coupled to the logic component forming at least two inverter components;
    wherein a first inverter component of the at least two inverter components has a first gate electrode layer, wherein the first gate electrode layer is electrically conductively connected to at least one of at least one interconnect and at least one via of a second inverter component of the at least two inverter components which interconnect and via electrically conductively connects the plurality of drain electrode layers and at least one first electrode of a charging component of the second inverter component.

5. The circuit as claimed in claim 4 wherein the at least one interconnect is in the plane of the at least one source electrode layer and the plurality of drain electrode layers, and wherein the first gate electrode layer and the at least one interconnect are electrically conductively connected to one another by at least one via in the semiconductor layer and the insulator layer.

6. The circuit as claimed in claim 4 wherein the first gate electrode layer is electrically conductively connected to the plurality of drain electrode layers and the at least one first electrode of the second inverter component by means of at least one via in the semiconductor layer and the insulator layer.

7. A logic component comprising:
    a field effect transistor comprising;
        at least one source electrode layer and a plurality of drain electrode layers arranged in the same plane;
        a semiconductor layer overlying the at least one source electrode layer and the plurality of drain electrode layers;
        an insulator layer overlying the semiconductor layer; and
        a gate electrode layer on the insulator layer, wherein as seen perpendicular to the plane of the at least one source electrode layer and the plurality of drain electrode layers the gate electrode layers is juxtaposed with only a portion of the source electrode layer and only a portion of the plurality of drain electrode layers such that only the portion of the source electrode layer and portion of the plurality of the drain electrode layers that are juxtaposed with the gate electrode layer are electrically operative as a transistor; and an electronic circuit comprising a plurality of electronic components electrically coupled to the logic component;

wherein the logic component is on a carrier substrate, wherein at least one first component of the plurality of components comprises a field effect transistor as set forth hereinabove and at least two second components each comprising an electrically conductive functional layer on the carrier substrate, the plurality of drain electrode layers of the first component being electrically conductively connected to the electrically conductive functional layer of one of the at least two second components by a printed interconnect such that at least one unused, surplus second component is present.

8. The logic component as claimed in claim 7 wherein the interconnect is printed in a given printing direction such that the at least two second components are arranged serially one after another and adjacent to one another in a direction defined by the printing direction of the interconnect.

9. The logic component as claimed in claim 7 wherein at least two first components are formed, and in that one of the first components is electrically conductively connected to one of the second components by the interconnect, such that at least one first component and at least one second component are present in unused and surplus fashion.

10. The logic component as claimed in claim 9 wherein the interconnect is printed in a given printing direction such that the at least two first components are arranged one after another and adjacent to one another as seen in the printing direction of the interconnect.

11. The electric circuit as claimed in claim 7 wherein a charging component having at least one first electrode forms an electrically conductive functional layer and at least one second electrode forms a second component, wherein the at least one second electrode is arranged for connection to a supply voltage.

12. A method for producing a logic component as claimed in claim 7 comprising:
    forming the carrier substrate;
    forming at least one first component having a drain electrode and at least two second components on the substrate, each component having an electrically conductive functional layer; and
    printing an electrically conductive interconnect in a given direction to electrically conductively connect the at least one first component drain electrode to one of the at least two second component electrically conductive functional layer to one another; such that the at least one first component, depending on the registration tolerance during the printing of the interconnect to the drain electrode and to the one of the at least two second components, is selectively connected to one or the other of the at least two second components such that at least one second component remains unconnected to the interconnect and unused.

13. The method as claimed in claim 12 including arranging the at least two second components serially one after another and adjacent to one another in the given printing direction of the interconnect.

14. The method as claimed in claim 12 wherein the forming the first component comprises forming at least two first components, and electrically connecting one of the first components to one of the second components by the interconnect, such that at least one first component and at least one second component remain unconnected and unused.

15. The method as claimed in claim 14 comprising forming the at least two first components serially one after another and adjacent to one another in the given printing direction of the interconnect.

* * * * *